United States Patent
Groves, Jr. et al.

(10) Patent No.: US 6,593,807 B2
(45) Date of Patent: Jul. 15, 2003

(54) DIGITAL AMPLIFIER WITH IMPROVED PERFORMANCE

(76) Inventors: William Harris Groves, Jr., 53 Melrose St., Arlington, MA (US) 02474; Arthur Alan Aaron, 88 Glenburn Rd., Arlington, MA (US) 02476

( * ) Notice: Subject to any disclaimer, the term of this patent is extended or adjusted under 35 U.S.C. 154(b) by 0 days.

(21) Appl. No.: 10/028,954

(22) Filed: Dec. 10, 2001

(65) Prior Publication Data

US 2002/0135419 A1 Sep. 26, 2002

Related U.S. Application Data

(60) Provisional application No. 60/257,888, filed on Dec. 21, 2000.

(51) Int. Cl.$^7$ .............................. H03F 3/38; H03F 3/217
(52) U.S. Cl. ..................... 330/10; 330/207 A; 330/251
(58) Field of Search ............................... 330/10, 207 A, 330/251

(56) References Cited

U.S. PATENT DOCUMENTS

| | | | |
|---|---|---|---|
| 4,520,438 A | | 5/1985 | Norton |
| 5,023,566 A | | 6/1991 | El-Hamamsy et al. |
| 5,057,720 A | | 10/1991 | Hattori |
| 5,548,286 A | * | 8/1996 | Craven ........................ 341/126 |
| 5,617,058 A | * | 4/1997 | Adrian et al. .................. 330/10 |
| 5,629,616 A | | 5/1997 | Weggel |
| 5,939,931 A | | 8/1999 | Noro |
| 5,982,231 A | | 11/1999 | Nalbant |
| 6,014,055 A | | 1/2000 | Chester |
| 6,028,476 A | | 2/2000 | Schweighofer |
| 6,097,249 A | | 8/2000 | Strickland et al. |
| 6,107,876 A | * | 8/2000 | O'Brien ........................ 330/10 |

* cited by examiner

Primary Examiner—Patricia T. Nguyen
(74) Attorney, Agent, or Firm—Michael E. Beach

(57) ABSTRACT

A class D amplifier uses a summation of two or more PWM output stages to achieve an increased dynamic range and improved linearity for any given clock operating speed. The amplifier accepts a digital data stream as its input, such as from a compact disk, or other compatible media, at a data rate, Fa, that could be 44.1 kHz, 96 kHz, or any other rate appropriate for audio data. In the preferred embodiment, the input audio data resolution, N bits, would be split into two data samples, of J and K.

Internal switching frequency, Fs, switches the PWM with an over sampling factor M, where Fs=M*Fa. The time resolution of the PWM is determined by a precision oscillator that operates at Fc=Fs*(max(J,K)−log2(M)+1).

The J most significant bits would be routed to a power PWM stage operated at a DC voltage of VHI. The K least significant bits are routed to a finesse PWM stage operated at a DC voltage of VLO.

The ratio of VLO to VHI will be appropriate for the ratio of K and J so the summation of the power PWM stage and the finesse PWM stage will provide the full range of N bits. This summation is accomplished with a low pass filter and time-division multiplexing of the two PWM stages.

A micro controller (MCU) is used to apply a sample packet distribution algorithm to provide more resolution by reducing quantization noise in the audio band of interest. The MCU is also used to calibrate the VLO or VHI, or to calibrate the PWM timing of the two PWM stages to achieve appropriate performance.

21 Claims, 5 Drawing Sheets

Block Diagram

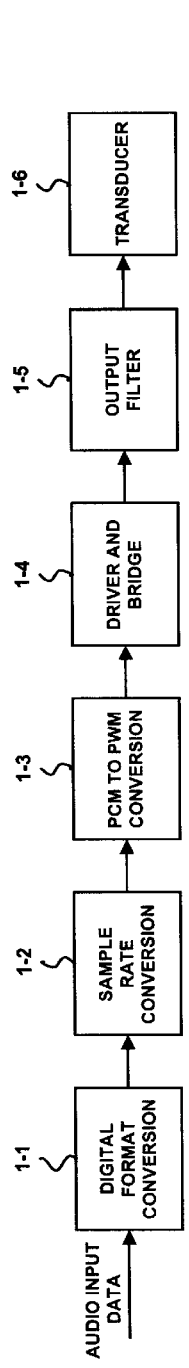
FIG 1: Prior Art
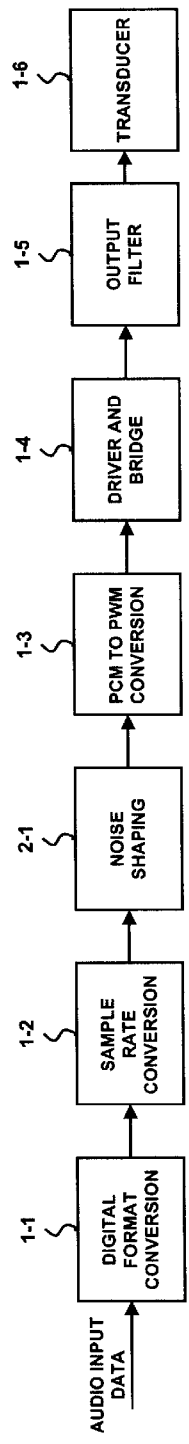
FIG 2: Prior Art
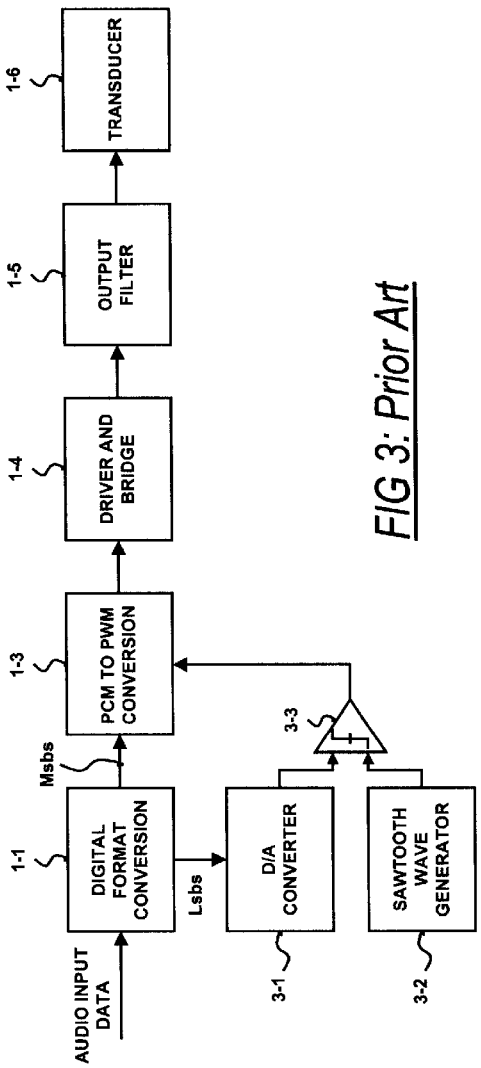
FIG 3: Prior Art

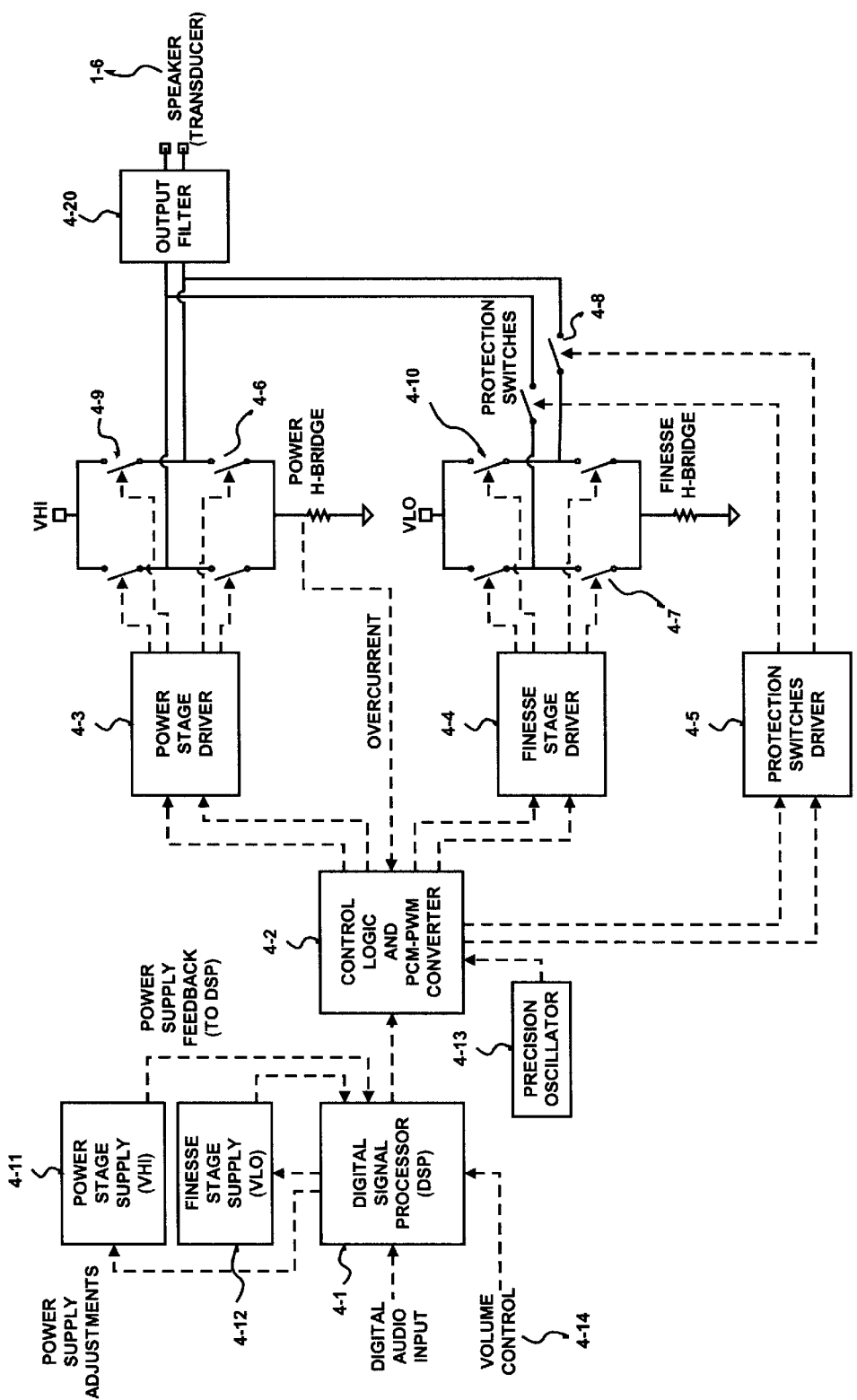
*FIG. 4: Block Diagram*

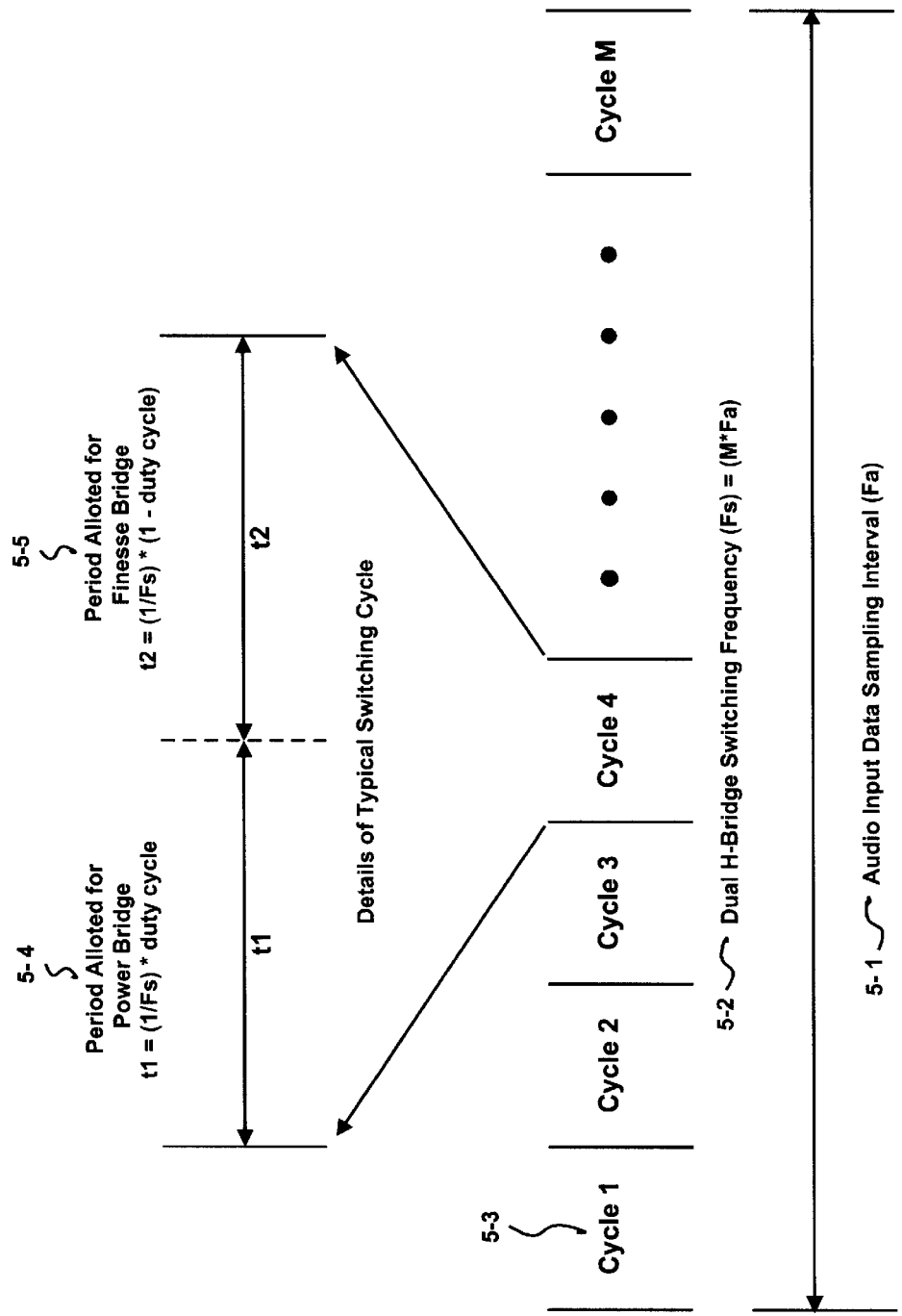
FIG 5: Dual Bridge Timing Overview

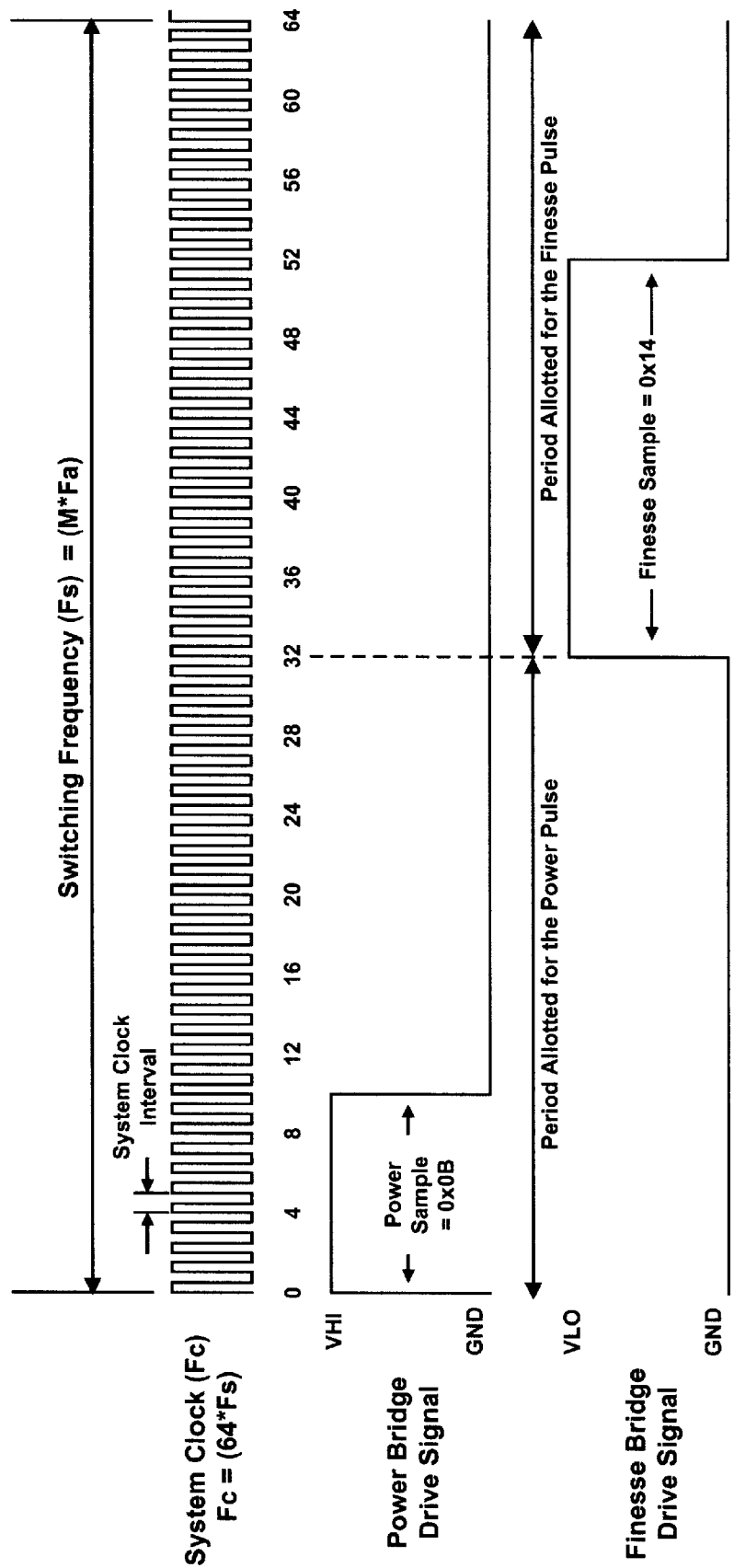
FIG. 6: Distribution Algotithm - 16-bit Example

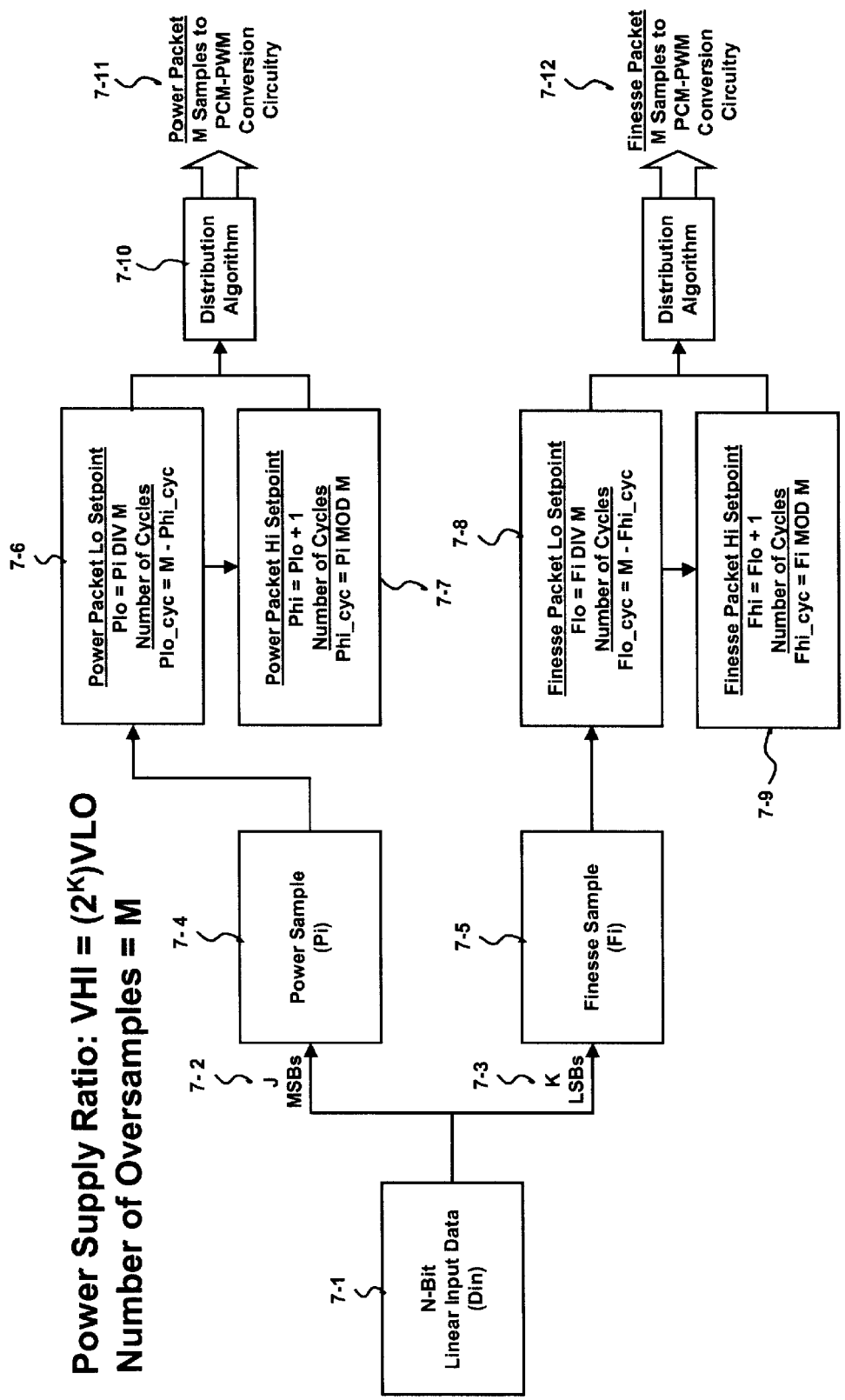
FIG. 7: Input Data to Packet Conversion Algorithm

DIGITAL AMPLIFIER WITH IMPROVED PERFORMANCE

This patent application claims the benefit of the filing date of the Provisional Patent Application 60/257,888, Titled "Digital Amplifier With Improved Performance", filed by William Harris Jr. Groves and Arthur Alan Aaron, filed on Dec. 21, 2000, under the rules of 35 USC 119(e).

1. FIELD OF THE INVENTION

This method refers to the field of electronic circuits and devices, and, mote particularly to a class D amplifier and related methods.

2. BACKGROUND OF THE INVENTION

A class-D amplifier is a power D/A converter that is based on the duty-cycle D/A converter topology. Output devices of the amplifier are alternately switched at very high rates between two reference voltages creating a stream of output pulses. Each output pulse is low-pass filtered to remove the constant switching frequency, leaving an output voltage that is proportional to the duty-cycle of the pulse width and the difference of the two reference voltages. The exact switching times of the output devices are determined by the analog or digital audio input signal. With the use of fast and efficient devices in the output stage, high fidelity reproduction of input signals can be created with very little power loss in the amplifier thus allowing more effective delivery to the intended load of a speaker transducer.

2.1. Prior Art #1—Digital Amplifier

A typical digital-input class D amplifier is shown in FIG. 1. Input data is converted from standard audio coding schemes (1-1) to a native magnitude representation. It is then sample rate converted (1-2) for further conversion by a pulse code modulation to pulse width modulation scheme (1-3). This in effect converts magnitude attributes to the time domain for purposes of switch modulation. The switching frequency of the output stage (1-4) of the amplifier is typically chosen at a frequency high enough to allow the output low-pass filter (1-5) to remove the switching frequency for low distortion in the output signal. However, with a switching frequency Fs=300 KHz, a system clock frequency of 300 KHz*$2^{16}$=19 GHz would be required in order to get a pulse width resolution of 16-bits. This unreasonable clock rate illustrates the limitations of this topology for audio CDs and other higher resolution digital formats currently on the market.

2.2. Prior Art #2—Digital Amplifier with Noise-Shaping Filter

A second digital-input class D amplifier topology is shown in FIG. 2. This scheme provides limited audio-band resolution and therefore requires a noise-shaping filter (2-1) to approach acceptable audio quality.

The noise-shaping filter reduces the required resolution of the input signal by placing the quantiser in a feedback loop with a digital filter, such that the filter quantisation error is subtracted from subsequent input samples.

However, system complexity and related risks are increased with the addition of a noise-shaping filter. By placing the quantiser in a feedback loop, artifacts such as jitter, quantisation error and stability limit the practical performance. Also, increasing the noise-shaping filter's order beyond three offers diminishing improvements in performance at reasonable oversampling rates.

2.3. Prior Art #3—Digital Amplifier with Dither Stage

A third prior art shown in FIG. 3 tries to overcome limits in resolution through an analog dithering scheme and is limited by the dithering circuitry. The dithering is accomplished by comparison (3-3) of a voltage generated by a D/A converter (3-1) against an analog ramp generator (3-2). However, quantisation errors of the D/A converter and linearity errors in the ramp generator limit the amount of resolution that may be obtained through the method.

3. SUMMARY OF THE INVENTION

In view of the above background information, it is an object of the present invention to provide an efficient digital amplifier with increased dynamic range, improved linearity and lower total harmonic distortion through unique processing algorithms and the summation of one or mote additional pulse width modulated (PWM output stages.

3.1. Overview

The main blocks of the amplifier include a microprocessor (MCU) or digital signal processor (DSP) (4-1), high-speed control logic (4-2), multiple power output stages (4-3,4-4) and an LC output filter (1-5). The MCU or DSP receives a stream of N-bit audio input data at a sampling rate Fa. Each input sample is split into lower resolution packets that are converted to output pulses by control logic. Each output stage packet contains M pulses that are output at an oversampling rate of Fs=M*Fa. Using a distribution algorithm each output pulse packet is passed to a power output stage. Each output stage is operating at the same switching frequency (Fs), but time-division multiplexed so each output stage is allotted a portion of the switching period. The power supplies (4-11,4-12) of each output stage are ratiometric so that each stage contributes a span of the original input sample. Each output stage span is summed and averaged with a LC low-pass reconstruction filter (4-20) before interfacing to the speaker load (1-6).

3.2. BRIEF DESCRIPTION OF THE DRAWINGS

FIG. 1 is a block diagram of a digital-input Class D amplifier according to prior art.

FIG. 2 is a block diagram of a digital-input Class D amplifier with noise-shaping filter according to prior art.

FIG. 3 is a block diagram of a digital-input Class D amplifier with an added dithering stage used to overcome resolution limitations.

FIG. 4 is a block diagram of a digital amplifier in accordance with the present invention.

FIG. 5 is a timing diagram showing the relationship between the digital input audio sampling frequency and the time periods allotted for switching of each output stage shown in FIG. 4.

FIG. 6 is a timing diagram detailing a single switching cycle of the 16-bit example of the distribution algorithm.

FIG. 7 is a block diagram showing the conversion of digital input data to pulse width values used in each switching cycle such as the one detailed in FIG. 6.

3.3. EXAMPLE #1

16 Bit, 44.1 KHz Input Audio

For example, consider a two-output stage amplifier for use with compact disc, 16 bit, 44.1 KHz input audio. Each input audio sample could be split into 2 packets of 8-bit samples, with one packet for each output stage. The packets would consist of 8, 5-bit samples with an oversampling rate of 8*44.1 KHz=352.8 KHz. The period of each switching cycle (1/352.8 KHz) is broken up into two sections with the pulse from output stage #1 occupying the first half of the period and the pulse from output stage #2 occupying the second half of the period. In order to get 5 bits of resolution for each pulse a master clock of $(2)*(2^5)*352.8$ KHz=22.58 MHz is used to clock the control logic which distributes the pulses. In order to reconstruct the input audio signal, in this example, the power supplies of the two output stages must be calibrated to have a ratio of 256:1.

3.3.1. Input Data Split Proportion

Note that the initial split of the input data does not have to be 50—50 between the two output stages. By altering the portion of the switching period allocated for each output stage and the ratio of the output stage power supplies, any desired split percentage may be accomplished. Such an ability, to alter stage proportions and power supply requirements, allows greater flexibility in dealing with real world issues namely practical power supply design and related needs for volume control or dynamic range.

3.3.2. Oversampling Benefits

In the above example, 16-bit resolution is obtained for a signal with a DC-22.051 KHz bandwidth. However, the effective resolution is actually 17.5 bits if the reduction in quantisation noise due to the 8× oversampling is considered. This is because the quantisation noise power remains constant regardless of the bandwidth if the errors associated with the quantisation process are assumed to be white and uncorrelated. Therefore, the noise power in the band of interest (0–22.5 Khz) is lower by a factor of 8 if the bandwidth is increased by a factor of 8. The low-pass filter at the output of the amplifier still has a cut-off frequency of 22.05 Khz ensuring that the majority of quantisation noise is filtered out of the amplifier output signal. The effective gain in resolution SNR is root (8) with the translation from noise power to noise. The general rule is that for each 4×oversampling, an extra bit can be dropped from a converter without affecting audio band performance.

3.4. EXAMPLE #2

20 Bit, 96 KHz Input Audio

As a second example, consider a two-output stage amplifier for use with 20 bit, 96 Khz input audio. Each input audio sample could be split into 2 packets of 10-bit samples, with one packet for each output stage. The packets would consist of 8, 7-bit samples at an oversampling rate of 8*96 KHz= 768 KHz. The period of each switching cycle (1/768 KHz) is broken up into two sections with the pulse from output stage #1 occupying the first half of the period and the pulse from output stage #2 occupying the second half of the period. In order to get 7 bits of resolution for each pulse a master clock of $(2)*(2^7)*768$ KHz=196 MHz is used to clock the control logic which distributes the pulses. In order to reconstruct the input audio signal, the power supplies of the two output stages in this example, must be calibrated to have a ratio of 1024:1. As with the 16-bit example, the resolution of the above amplifier is increased by 1.5 bits (to 21.5 bits) due to the 8× oversampling.

3.4.1. Higher Resolution at Lower Frequencies

Additional resolution is also obtained as the output signal frequencies get farther away from the sampling frequency and are integrated. The system above has 21.5 bits of resolution at 22.05 Khz but also has 22.5 integral bits of resolution at 11.025 KHz and 23.5 integral bits of resolution at 5.50125 KHz, etc. Since, as it is noted in the literature (Psychoacoustics: Facts and Models (Springer Series in Information Sciences, 22) by Eberhard Zwicker, H. Fastl, H. Frater and The Psychology of Music (Academic Press Series in Cognition and Perception) by Diana Deutsch (Editor)) that most of the energy of music is within a DC-10 Khz bandwidth and that most listeners cannot hear frequencies >12 Khz, the system has an even higher resolution in the listener's band of interest.

3.5. Conclusion

With switching power supply speeds of >1 MHz along with system clock speeds >1 GHz obtainable in current technology, this method is useful for all data formats in the market today and in the foreseeable future.

4. DETAILED DESCRIPTION OF THE PREFERRED EMBODIMENTS

We will describe the embodiment of this invention in detail, but it is assumed that the invention is not limited to this single embodiment. Although this invention describes a process of time-division multiplexing any number of switching output stages, for simplicity and ease of understanding the invention will describe a summation of two stages.

4.1. Input-Data to Sample Packets Conversion

The initial stage of the digital amplifier consists of a digital signal processor or MCU (4-1) that receives the N-bit audio input data at a sampling rate of Fa. At this point, the present invention provides the ability to preprocess this data to provide increased output performance. One form of preprocessing is frequency masking to conserve power in the speakers. As described above, a second form of preprocessing would be noise-shaping to increase the dynamic range of the amplifier. With the present invention only a minimal amount of noise-shaping would be required to cover all of the audio formats on the market today.

Each N-bit audio data sample (7-1) is split into two data samples, one sample of J bits (7-2) and one sample of K bits (7-3) where J+K=N. The J-bit sample represents the most significant bits of the original sample and will be referred to as the power sample (7-4). The K-bit sample represents the least significant bits of the original sample will be referred to as the finesse sample (7-5).

Each power sample is converted from a J-bit, Fa sample to a packet of M lower resolution samples (7-6,7-7) at an oversampling rate Fs=M*Fa. The resolution of each sample in the power packet is K–$\log_2$(M).

Each finesse sample is converted from a K-bit, Fa sample to a packet of M lower resolution samples (7-8,7-9) at an oversampling rate Fs=M*Fa. The resolution of each sample in the finesse packet is K–$\log_2$(M).

In the 16-bit, 44.1 KHz (example #1) input data example described above the input data is broken up into two stages with J=8 and K=8. Each 8-bit sample of both the power and finesse stages is converted into packets of M=8 samples at an oversampling rate of Fs=8*44.1 Khz=352.8 KHz. The resolution of each sample in both the power and finesse packet is 8–$\log_2$M)=5.

The calculation of the oversampling data of a packet is the same for both the power stage and finesse stage. Algorithms for the packet calculations are shown below:

Given

M—Number of samples in the packet
Din—Input Sample Value
Plo—Packet Low Setpoint
Phi—Packet High Setpoint
Plo_cyc—Number of Cycles to output Plo
Phi_cyc—Number of Cycles to output Phi
Then
Plo=Din DIV M
Phi=Plo+1
Plo_cyc=M−Phi_cyc
Phi_cyc=Din modulo M

4.2. Sample Packet Distribution Algorithm

A distribution algorithm (7-10) is used to sequence the samples in each power and finesse sample packet so that the harmonic frequencies generated from the changing samples is pushed as far as possible away from the audio bandwidth.

Consider a 16-bit audio input data word of 0x54A2 (with the "0x" prefix signifying a hexadecimal number).

With J=8 and K=8 the power sample is 0x54 and the finesse sample is 0xA2. Using the algorithm described above, The oversampling power packet consists of the following 8 samples:

| Plo = 0x0A, | Plo_cyc = 4 |
|---|---|
| Phi = 0x0B, | Phi_cyc = 4 | and the oversampling finesse packet consists of:

| Plo = 0x14, | Plo_cyc = 6 |
|---|---|
| Phi = 0x15, | Phi_cyc = 2 |

In order to push the harmonic frequencies out of the audio bandwidth, the distribution algorithm would sequence the above samples in the following order:

Power packet—[0x0B, 0x0A, 0x0B, 0x0A, 0x0B, 0 x0A, 0x0B, 0x0A]

Finesse Packet—[0x14, 0x14, 0x15, 0x14, 0x14, 0x15, 0x14, 0x14]

The first oversampling cycle of this 16-bit example is shown in FIG. 6 with a power oversample of 0x0B and a finesse oversample of 0x14.

In this example, both distributed packets have fundamental frequencies that ate up to eight times higher than the sampling frequency, and up to 4 times higher than an undistributed sample packet.

Said scheme is not limited to redistribution within a single frame and as such may further extend its benefits of sample integration for the sake of lower noise and further reduced quantization errors.

As a second example, consider a 24-bit audio input data word of 0x7B36D5 (with the "0x" prefix signifying a hexadecimal number).

With J=12 and K=12 the power sample is 0x7B3 and the finesse sample is 0x6D5. Using the algorithm described above, The oversampling power packet consists of the following 8 samples:

| Plo = 0xF6, | Plo_cyc = 5 |
|---|---|
| Phi = 0xF7, | Phi_cyc = 3 | and the oversampling finesse packet consists of:

| Plo = 0xDA, | Plo_cyc = 3 |
|---|---|
| Phi = 0xDB, | Phi_cyc = 5 |

In order to push the harmonic frequencies out of the audio bandwidth, the distribution algorithm would sequence the above samples in the following order:

Power packet—[0xF6, 0xF6, 0xF7, 0xF6, 0xF7, 0xF6, 0 xF7, 0xF6]

Finesse Packet—[0xDB, 0xDB, 0xDA, 0xDB, 0xDA, 0xDB, 0xDA, 0xDB]

4.3. Sample Packet to PWM Conversion Hardware

Control logic (4-2) converts each lower resolution power and finesse samples to digital pulses. The resolution of each digital pulse is determined by a precision oscillator (4-13), which clocks the control logic at a rate of Fc=Fs* (max(J, K)-$\log_2$(M)+1). The power pulse is initiated at the onset of the 1/Fs sampling period (5-4) and the finesse pulse is initiated at a point way through the sampling period (5-5). Since the two pulses are 180° out of phase and the maximum pulse width of each sample is 1/(2*Fs) there is no overlap between the two pulses each sampling period.

4.4. PWM Drivers and H-Bridge

The digital pulses from the control logic interface to the PWM drivers for the power (4-3) and finesse stages (4-4). These high current drivers translate the digital input signals to high speed, high current pulses that turn-on the switches in the output bridges (4-6,4-7) of each stage at an extremely fast rate. The differential output voltages of the each bridge are equivalent in period to the input pulses, however they now span from ground to the power supply rail of the bridge. Through the use of fast, low-impedance switches the output load may be driven with minimal loss of signal quality through the driver/bridge circuitry.

The present invention can make use of a parallel bridge driver scheme in either the power (4-3,4-6,4-9) or finesses stage (4-4,4-7,4-10) that allows an improvement in speed and a reduction in power losses. It achieves this benefit by parallel connection of, for each FET position improved, a slower, more efficient (lower Rds ON) FET connected with a faster (higher Rds ON) less efficient FET. Thus the best attributes of both FETs are utilized. Both of these parallel FETs are driven from the same logic signal through separate high-current drivers. The low loss FET turns on shortly after the faster less efficient FET, relieving the power loss when it turns on.

A third driver high current driver (4-5) controls protection switches (4-8) that isolate the low bridge during the portion of the switching cycle when the power bridge is enabled. Without this protection, the power stage supply would become shorted to the finesse stage supply through the internal body diodes of the finesse bridge switches.

4.5. Power Supplies

As stated above, the digital pulses from the control logic are translated through each driver and H-bridge from a digital pulse to a high-voltage pulse that spans from ground to the power supply rail of the bridge. In order to provide an output signal that is an accurate representation of the digital input signal, the bridge power supplies (4-11,4-12) will be calibrated, stable, low-noise, and responsive to high current transients.

To accurately reproduce the input sample, the power supplies of each output stage are calibrated, by the MCU, as ratio-metric such that each stage contributes the correct span of the original input sample. The ratio between VHI and VLO matches the number of data bits desired from the power and finesse bridge contributions respectively.

For example, if the finesse stage is to provide 8-bits of resolution, then the ratio of VHI to VLO needs to be 256:1 since $2^8$=256. Another way to state this is that VLO=VHI* ($\frac{1}{256}$), when the finesse stage, powered by VLO, is to provide 8 bits of resolution.

The present invention can utilize the MCU to control the volume (4-14) of the output signal by changing the level of the power supplies, VHI and VLO, while accurately maintaining that matched ratio.

4.6. Output Filter

The present invention employs an LC output filter (4-20) to sum and average the outputs of the power and finesse bridges. This low-pass filter also integrates the high-frequency switching contribution from each bridge. This effectively provides the speaker, or transducer, with a more accurate signal that has had the inaudible high frequency components removed.

The −3 db frequency of this reconstruction filter is set just above the desired audio bandwidth of the amplifier. With this choice, low frequency audio signals of interest remain unaffected while the majority of high-frequency switching noise is filtered from the output signal. The −3 db point of the filter is also dependent on the speaker, or transducer's impedance. If, for example, the speaker is changed from 2 Ohms to 8 Ohms, as measured in a system calibration procedure, the exact L and or C components of the LC output filter (4-20) can be electronically or mechanically selected, at that time, for optimal performance.

4.7. Calibration

The MCU (4-1) can be used to calibrate the entire system to compensate for system non-linearities, component aging, speaker load changes (8 Ohms, vs 2 Ohms), etc. This allows improved performance at a lower manufacturing cost, since the exact matching of the power FETs is not needed, if the variation, part to part, can be calibrated by the MCU.

In practice, the MCU would perform a system calibration to establish the dynamic and static operating parameters of the turn-on and turn-off of the FETs, and to establish and calibrate the ratio of VHI to VLO, without the need of expensive, and increasingly ineffective over time, human calibration. It is known the proposed scheme any variations would be very small, and would change slowly, such that a calibration upon power-up is more than adequate to achieve excellent performance levels. Said non-real-time calibration, while adjusting for system variations as described, avoids the stability problems associated with high-slew closed-loop feedback power amplifiers.

Similarly LC output filter requirements can be established and adjusted for during the system calibration.

4.8. Signal Pre-Processing

As has been stated the MCU can be used to calibrate the entire system to compensate for system non-linearities, component aging, speaker load changes (8 Ohms, vs 2 Ohms), etc. It can also be used to provide related balance of power supply levels against input data scaling as needed for user control of volume, and as a means of accepting various input formats. Input format compatibility, for various sample rates, dynamic range, and channel assignments, is to be accomplished through code changes in the MCU.

A less obvious application of the MCU controller is to further reduce power requirements and speaker loading by removal of redundant or not perceivable spectra for the exact purposes of reduction of power wasted within the amplifier and reduced waste as dissipation by the speaker load. Elimination of such redundant signals allows effective allocation of finite power resources reducing costs and or performance rather than, as in classic systems that are less selective, wasting the power and increasing the need for accommodation of related waste.

It is noted in the literature (Psychoacoustics: Facts and Models (Springer Series in Information Sciences, 22) by Eberhard Zwicker, H. Fastl, H. Frater and The Psychology of Music (Academic Press Series in Cognition and Perception) by Diana Deutsch (Editor)) that the human ear cannot perceive frequencies that ate either spectrally or temporally "masked". The present invention can utilize the MCU, programmed with such rules, to describe masking and with apriori access to incoming data and system parameters, can remove such unperceivable signals to reduce transient and average power requirements from the electrical service through amplifier through speaker. In addition, to power reduction benefits, a related audio quality improvement can be gained as the demands on the speaker, or similar transducer and it's crossover circuit if any, are reduced mechanically, electrically, and thermally.

Other proprietary preprocessing, or information formatting, may include but not be limited to signal distribution through multiple channels for purposes of load balancing (i.e. Very low frequency non directional signal could be moved to & from several amplifier channels and speaker loads). Such schemes would be aware of and support the processing of multi channel data formats as decoded by the same MCU.

What is claimed is:

1. A class D amplifier comprising:
   a means for accepting digital format audio data;
   a means for converting the individual M-bit data samples into at least two packets, wherein each packet represents a subset of the total M-bits of the data sample;
   a means for providing a PWM signal to at least one power stage, operated from a voltage rail, VHI;
   a further means for providing a second PWM signal to at least one low voltage stage, operated from a lower voltage rail, VLO, the voltage of which is related to VHI by the ratio of the split of the total M-bits to the two stages;
   a means to combine the outputs of the power stage and the low voltage stage so that the signal to the speaker transducer can reproduce the resolution of M-bit original source data.

2. The class D amplifier of claim 1 wherein said power stage, and said low voltage stage are each comprised of semiconductor switching elements that are controlled by the appropriate corresponding PWM signal; each semiconductor switching element is further comprised of a parallel combination of a fast switching semiconductor device and a slower switching but more power efficient semiconductor device, in order to improve switching speed and power efficiency.

3. The class D amplifier of claim 1 wherein protection switches are used to isolate the low voltage stage from the power stage, while the power stage is in use.

4. The class D amplifier of claim 1 wherein VLO is generated by a tracking regulated DC power supply that is ratio-metrically related to the voltage value of VHI.

5. The class D amplifier of claim 4 wherein the VHI and VLO power supplies are calibrated, low noise, stable and immune to disturbance by transients.

6. The class D amplifier of claim 4 wherein the means to establish the ratio-metric relationship of VLO to VHI is performed by a micro controller.

7. The class D amplifier of claim 1 which includes a means to adjust the output volume by adjusting the values of VHI and VLO.

8. The class D amplifier of claim 7 wherein the means to adjust the values of VHI and VLO is performed by a micro controller.

9. The class D amplifier of claim 1 wherein a micro controller means is used to perform an initial system calibration.

10. The class D amplifier of claim 1 wherein a micro controller means is used to distribute multiple PWM sample packets within a single audio sample interval to reduce unwanted harmonic frequencies in the audio bandwidth.

11. The class D amplifier of claim 1 wherein a microcontroller means is used to remove redundant audio components to reduce power consumption of the amplifier.

12. A method for operating a class D amplifier comprising the steps of:
- accepting digital format audio data that has M-bits per sample;
- converting the individual M-bit data samples into at least two data packets, wherein each data packet represents a subset of the total M-bits of the data sample;
- generating a PWM signal for each of said data packets;
- combining the all the outputs of all the said PWM signals so that the signal to the speaker transducer can reproduce the resolution of the M-bit original source data.

13. The method for operating a class D amplifier of claim 12 whereby generating said PWM signal is accomplished using an H-bridge that is comprised of individual parallel switching elements to provide a means to improve switching speed and power efficiency.

14. The method for operating a class D amplifier of claim 12 wherein the controlling of protection switches isolates each of the PWM signals from each other.

15. The method for operating a class D amplifier of claim 12 which further comprises using two data packets, generating two voltage rails, VHI and VLO, using a tracking regulated power supply, so that VHI is ratio-metrically related VLO just as the two said data packets are related to the original M bit audio data, generating a first PWM signal using VHI, and generating a second PWM signal using VLO.

16. The method for operating a class D amplifier of claim 15 wherein establishing the ratio-metric relationship of VLO to VHI is performed by a micro controller.

17. The method for operating a class D amplifier of claim 12 where adjusting the values of VHI and VLO controls the output volume.

18. The method for operating a class D amplifier of claim 17 where adjusting the values of VHI and VLO is performed by a micro controller.

19. The method for operating a class D amplifier of claim 12 which further comprises performing an initial system calibration using a micro controller.

20. The method for operating a class D amplifier of claim 12 which further comprises distributing the multiple output signals of said PWM data packets within a single audio sample interval, to reduce unwanted harmonic frequencies in the audio bandwidth, using a micro controller.

21. The method for operating a class D amplifier of claim 12 which also comprises removing redundant audio components, to reduce power consumption of the amplifier, using a micro-controller.

* * * * *